United States Patent
Ker et al.

(10) Patent No.: US 6,448,641 B2
(45) Date of Patent: *Sep. 10, 2002

(54) LOW-CAPACITANCE BONDING PAD FOR SEMICONDUCTOR DEVICE

(75) Inventors: Ming-Dou Ker, Hsinchu (TW); Hsin-Chin Jiang, Taipei (TW)

(73) Assignee: Industrial Technology Research Institute, Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/329,648

(22) Filed: Jun. 9, 1999

(30) Foreign Application Priority Data

Mar. 19, 1999 (TW) .......................................... 88104304

(51) Int. Cl.⁷ ........................... H01L 23/12; H01L 21/44
(52) U.S. Cl. ........................ 257/700; 257/758; 257/774; 257/775; 257/781; 257/784; 257/786; 438/617; 438/622; 438/666
(58) Field of Search ................................ 257/758, 784, 257/786, 700, 774, 78, 780, 781, 773, 775, 701; 438/612, 614, 125, 618, 622, 617, 629, 637, 639, 666

(56) References Cited

U.S. PATENT DOCUMENTS

| | | | | |
|---|---|---|---|---|
| 5,394,013 A | * | 2/1995 | Oku et al. ................... | 257/786 |
| 5,404,047 A | * | 4/1995 | Rostoker et al. ............. | 257/786 |
| 5,463,255 A | * | 10/1995 | Isono .......................... | 257/773 |
| 5,502,337 A | * | 3/1996 | Nozaki ........................ | 257/773 |
| 5,739,587 A | * | 4/1998 | Sato ............................ | 257/758 |
| 5,751,065 A | * | 5/1998 | Chittipeddi et al. ........ | 257/758 |
| 5,838,043 A | * | 11/1998 | Yuan ........................... | 257/355 |
| 5,869,357 A | * | 2/1999 | Zambrano ................... | 438/129 |
| 5,986,343 A | * | 11/1999 | Chittipeddi et al. ........ | 257/758 |
| 6,043,144 A | * | 3/2000 | Kuo ............................ | 438/612 |
| 6,100,573 A | * | 8/2000 | Lu et al. ..................... | 257/508 |
| 6,163,074 A | * | 12/2000 | Lee et al. .................... | 257/734 |
| 6,180,993 B1 | * | 1/2001 | Wang et al. ................. | 257/529 |
| 6,207,547 B1 | * | 3/2001 | Chittipeddi et al. ........ | 438/612 |
| 6,222,270 B1 | * | 4/2001 | Lee ............................. | 257/758 |
| 6,261,944 B1 | * | 7/2001 | Mehta et al. ................ | 438/624 |
| 6,291,331 B1 | * | 9/2001 | Wang et al. ................. | 438/618 |
| 6,313,537 B1 | * | 11/2001 | Lee et al. .................... | 257/758 |

FOREIGN PATENT DOCUMENTS

JP    63-70442    * 3/1988

* cited by examiner

Primary Examiner—David L. Talbott
Assistant Examiner—Alonzo Chambliss
(74) Attorney, Agent, or Firm—J.C. Patents

(57) ABSTRACT

A low-capacitance bonding pad for a semiconductor device. A diffusion region is formed in a substrate, and a bonding pad is formed on the substrate and aligned with the diffusion region. The bonding pad is made from a stacked metal layer and a metal layer. The stacked metal layer is made from a plurality of metal layers and a plurality of dielectric layers, and the metal layers and the dielectric layers are stacked alternately. The metal layers stacked in the stacked metal layer are formed with small areas. Each of the metal layers stacked in the stacked metal layer is coupled with the adjacent metal layer by via plugs.

13 Claims, 12 Drawing Sheets

LOW-CAPACITANCE BONDING PAD FOR SEMICONDUCTOR DEVICE

CROSS-REFERENCE TO RELATED APPLICATION

This application claims the priority benefit of Taiwan application serial no. 88104304, filed Mar. 19, 1999, the full disclosure of which is incorporated herein by reference.

BACKGROUND OF THE INVENTION

1. Field of the Invention

The present invention relates to a semiconductor device. More particularly, the present invention relates to a bonding pad with low capacitance for a semiconductor device.

2. Description of the Related Art

Trends for electrical products are light, short, small, and thin. Usually, the chips manufacturing technology and the packaging technology are rapidly developed to meet these trends. However, due to a limitation of bonding machines, a size of a bonding pad for a semiconductor device is not reduced as well as a line width of a chip is greatly reduced. Because the size of the bonding pad is insufficiently small, an area of a substrate overlapped by the bonding pad is large. As a result, a parasitic capacitance of the bonding pad remains high. Additionally, a peel-off effect often occurs while forming the bonding wire, so that bonding reliability is decreased.

FIG. 1 is a cross-sectional view, schematically illustrating a conventional bonding pad.

Referring to FIG. 1, a dielectric layer 12 is formed on a substrate 10, and a metal layer 14 is formed on the dielectric layer 12. A passivation layer 16 having a bonding pad opening 18 is formed on the metal layer 14. A bonding pad wire 19 is formed on the metal layer 14 within the bonding pad opening 18. A parasitic capacitance of the bonding pad maybe small if the distance between the substrate 10 and the metal layer 14 is large. But if the bonding pad is only formed by the uppermost metal layer to increase the distance between the substrate 10 and the metal layer 14, the peel-off effect, denoted as a region 17, often occurs during formation of the bonding wire 19 and chip packaging. The bonding reliability is therefore reduced due to the peel-off effect.

SUMMARY OF THE INVENTION

The present invention provides a low-capacitance bonding pad for a semiconductor device so as to avoid a peel-off effect and reduce a parasitic capacitance of the bonding pad.

To achieve these and other advantages and in accordance with the purpose of the invention, as embodied and broadly described herein, the invention provides a low-capacitance bonding pad for a semiconductor device. A diffusion region is formed in a substrate at a region on which a bonding pad is to be formed. The bonding pad includes a stacked metal layer and a metal layer, in which the metal layer is on the stacked metal layer. The stacked metal layer includes several metal layers and several dielectric layers, in which the metal layers are isolated by the dielectric layers in between by alternately stacking them up. The metal layers stacked in the stacked metal a layer are formed with small areas. Each of the metal layers stacked in the stacked metal layer is coupled with an adjacent metal layer by a via plug.

Since the bonding pad includes several metal layers and buried deeply in the dielectric layer, the peel-off effect is effectively avoided. An area of the substrate overlapped by the metal layers stacked in the stacked metal layer is small because the areas of the metal layers stacked in the stacked metal layer are small. As a result, the parasitic capacitance of the bonding pad is also effectively reduced. Moreover, the parasitic capacitance of the bonding pad is further reduced due to the diffusion region in the substrate, which serves as an additional capacitor coupled in series to the capacitor induced by the metal layers. The metal layers in the stacked metal layer can include various geometry structures. For example, the metal layer includes several metal bars in one layer and crosses to each other in different layer in different bar direction so as to form a geometric structure, such as a net structure or any other overlapping structure.

To achieve these and other advantages and in accordance with the purpose of the invention, as embodied and broadly described herein, the invention provides another low-capacitance bonding pad for a semiconductor device. A device is formed under a bonding pad which is made from a stacked metal layer and an uppermost metal layer. The metal layers stacked in the stacked metal layer are formed with small area and each area of the metal layer in the stacked metal layer is smaller than the uppermost metal layer.

The device is formed on a substrate. Several metal layers close to the device serve as signal lines. Several metal layers stacked on the metal layers as signal lines serve as power lines, and other metal layers stacked on the power lines serve as the bonding pad which consists of a stacked metal layer and an uppermost metal layer. The metal layers in the stacked metal layer can include various geometry structures. For example, the metal layer includes several metal bars in one layer and crosses to each other in different layer in different bar direction so as to form a geometric structure, such as a net structure or any other overlapping structure.

Because the device is formed between the bonding pad and the substrate, an area of the integrated circuits layout is reduced. The area of the substrate overlapped by the metal layers stacked in the stacked metal layer is small since areas of the metal layers are small, so that the parasitic capacitance of the bonding pad is reduced. The peel-off effect is avoided and the bonding reliability increases because the bonding pad includes the stacked metal layers which are buried deeply in the dielectric layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

In FIGS. 7 and 8, the metal layers are referred in numerals 710, 720, 730, 740 and 750. Each of the metal layers 710, 720, 730 and 740 are designed as a bar, and the metal layer 750 is a planar layer. The metal layers 710, 720, 730 and 740 are aligned with each other and are isolated by several dielectric layers 212, 222, 232, 242 in between. A top dielectric layer 252 covers the metal layer 740. The metal layer 750 is located on the dielectric layer 252. Additionally, a direction of the metal layers 710, 720, 730 and 740 deviates from the direction 400 (FIG. 2) with an angle, which preferably is 45 degrees in this embodiment, such that the metal layers are arranged in hatch.

FIG. 8 is a schematic drawing, illustrating a cross-sectional view of FIG. 7 taken along a line VIII—VIII;

FIG. 1 1 is another schematic drawing, illustrating a top view of a bonding pad layout according to the invention;

DESCRIPTION OF THE PREFERRED EMBODIMENTS

Figure 1:
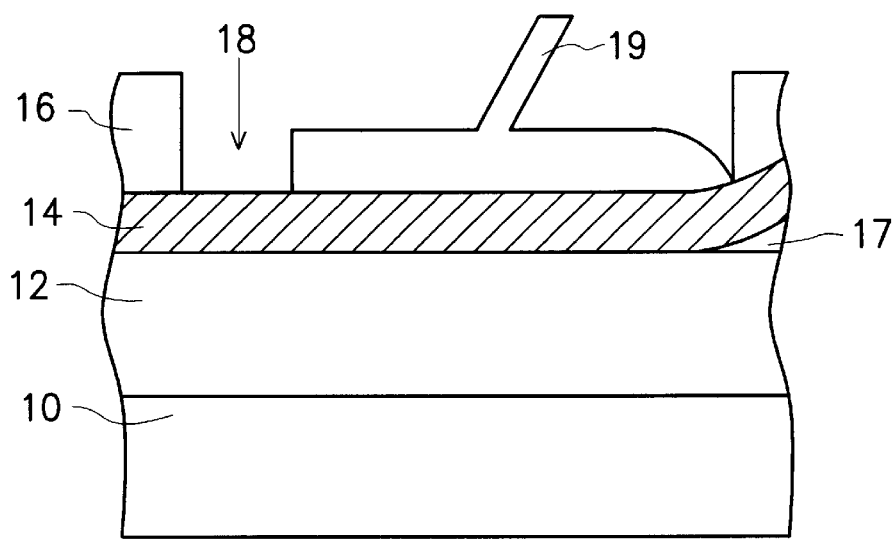
FIG. 1 is a schematic drawing, illustrating a cross-sectional view of a conventional bonding pad.

Reference will now be made in detail to the present preferred embodiments of the invention, examples of which are illustrated in the accompanying drawings. Wherever possible, the same reference numbers are used in the drawings and the description to refer to the same or like parts.

EXAMPLE 1

Figure 2:
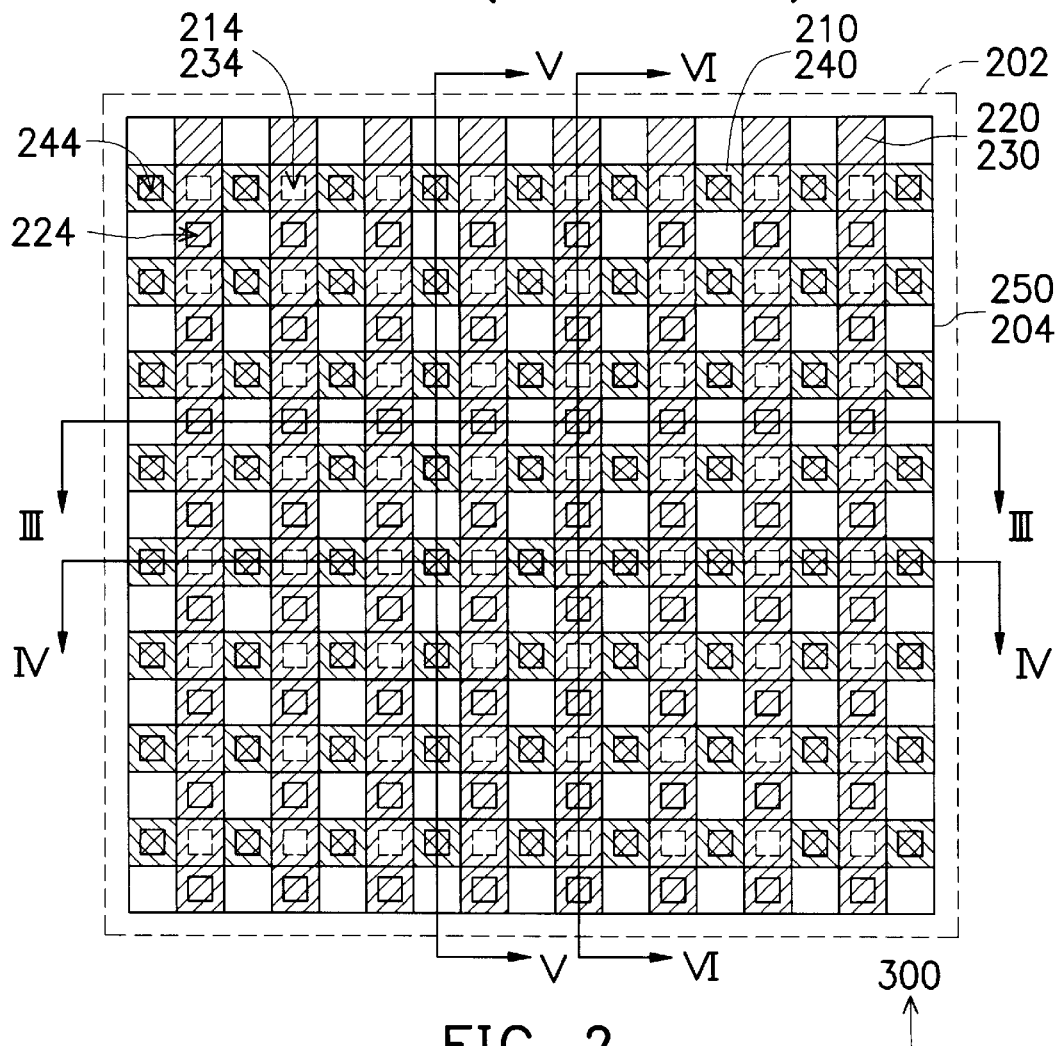
FIG. 2 is a schematic drawing, illustrating a top view of a bonding pad layout according to the invention.

FIG. 2 is a schematic drawing, illustrating a top view of a bonding pad layout according to the invention. FIGS. 3, 4, 5 and 6 are schematic drawings, illustrating cross-sectional views of FIG. 2 taken along lines III—III, IV—IV, V—V and VI—VI, respectively.

Figure 4:
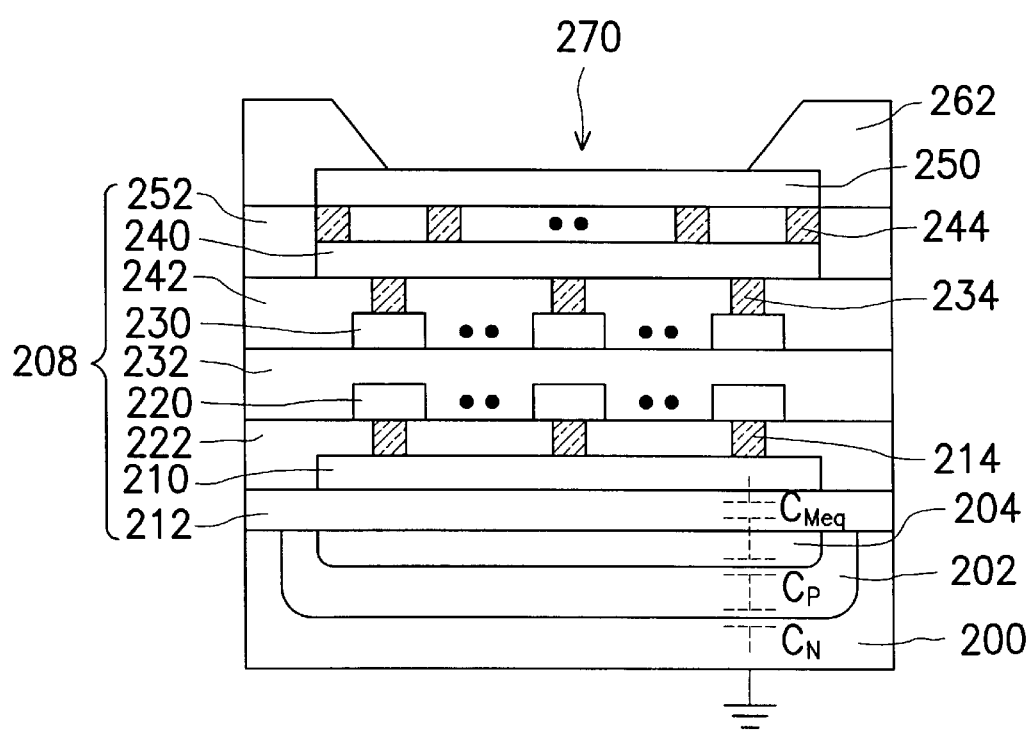
FIG. 4 is a schematic drawing, illustrating a cross-sectional view of FIG. 2 taken along a line IV—IV.

Referring to FIGS. 2 and 4, a p-type substrate 200 having an n-well 202 is provided. A p-type doped region 204 is formed as a diffusion region in the n-well 202. A bonding pad includes a stacked metal layer 208 and a metal layer 250 lies located on the p-type substrate 200 and is aligned with the p-type doped region 204. The stacked metal layer 208 includes several metal layers 210, 220, 230, 240 and several dielectric layers 212, 222, 232, 242, 252. Additionally, the metal layers 210, 220, 230, 240 and the dielectric layers 212, 222, 232, 242, 252 are stacked alternately on the p-type substrate 200. The metal layer 250 is formed on the dielectric layer 252. In this structure as described above, a junction capacitance $C_P$ occurs between the n-well 202 and the p-type doped region 204. A junction capacitance $C_N$ occurs between the n-well 202 and the p-type substrate 200. A total equivalent capacitance $C_{Meq}$ also occurs due to contribution from the metal layers 210, 220, 230, 240, 250. All the capacitance of $C_P$, $C_N$, and $C_{Meq}$ are coupled in series so that a parasitic capacitance of the bonding pad is effectively reduced.

The metal layers 210, 220, 230, and 240 are all designed, for example, to have a bar structures in this embodiment but the metal layer 250 is a planar layer. Each width of the metal layers 210, 220, 230 and 240 is designed to be as small as possible, so that an area of the p-type substrate 200 overlapped by the metal layers 210, 220, 230 and 240 is reduced. This is significantly helpful to reduce the parasitic capacitance of the bonding pad.

Figure 3:
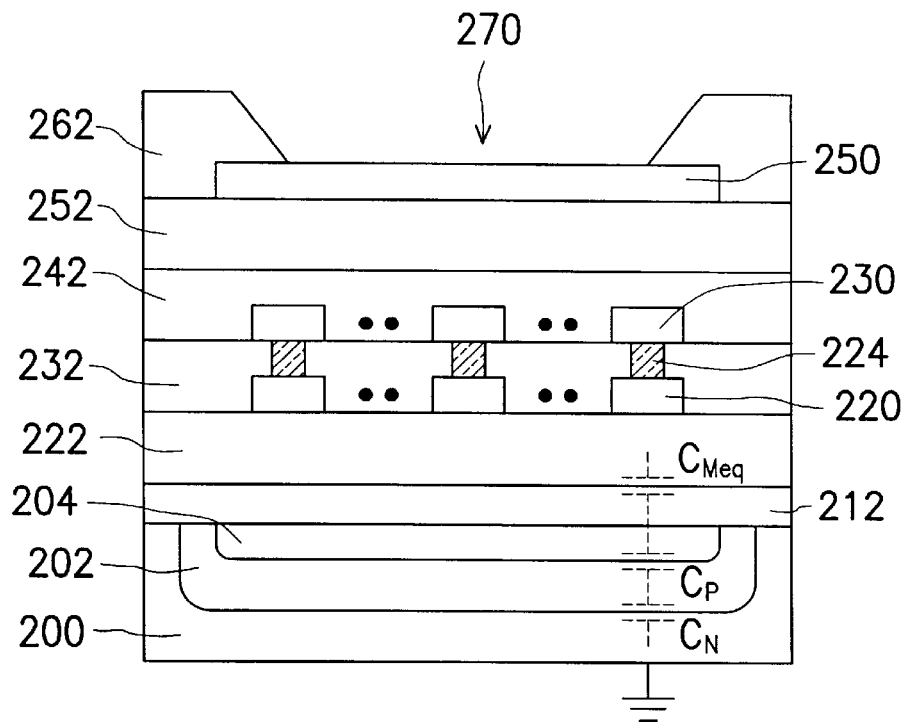
FIG. 3 is a schematic drawing, illustrating a cross-sectional view of FIG. 2 taken along a line III—III.
Figure 5:
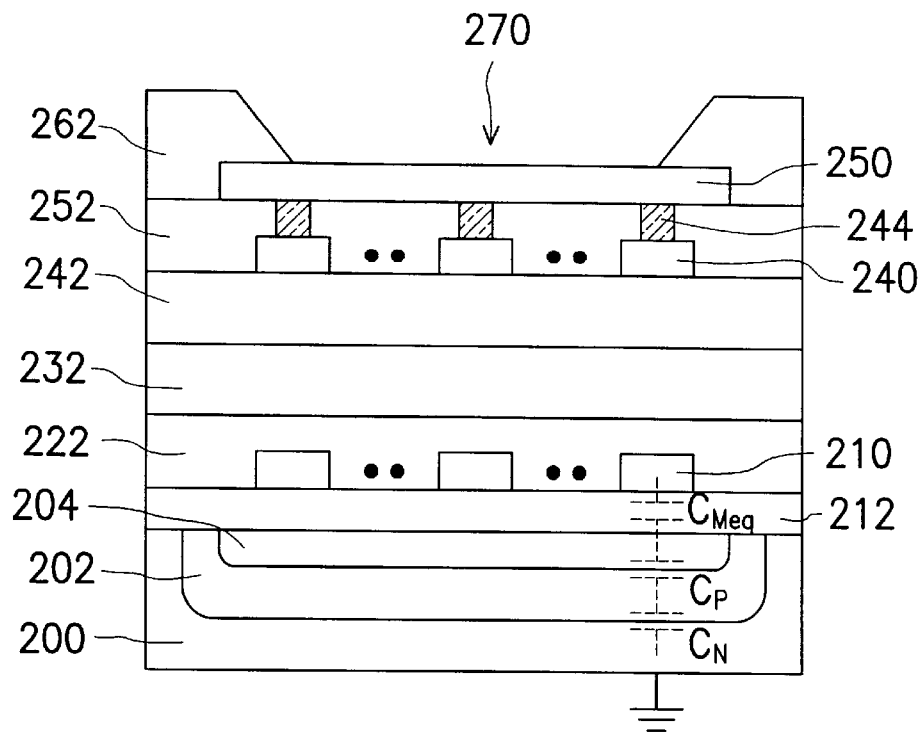
FIG. 5 is a schematic drawing, illustrating a cross-sectional view of FIG. 2 taken along a line V—V.
Figure 6:
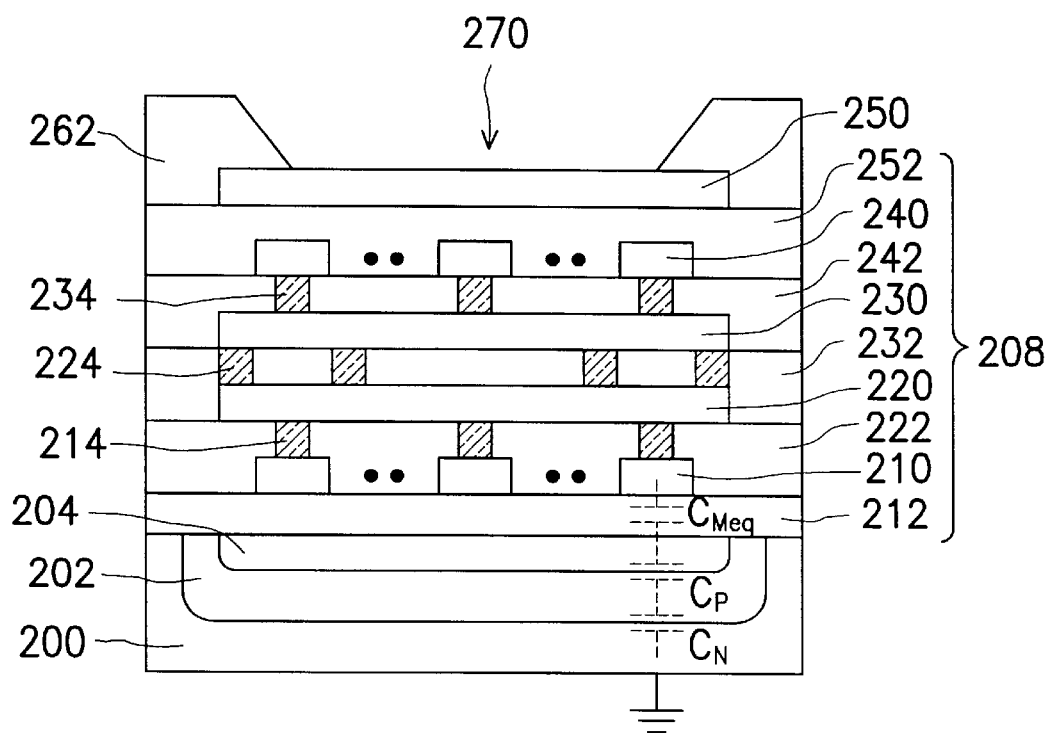
FIG. 6 is a schematic drawing, illustrating a cross-sectional view of FIG. 2 taken along a line VI—VI.

The metal layers 210 and 240 are parallel to a row direction 400 shown in FIG. 2, and the metal layer 240 is aligned with the metal layer 210. Additionally, the metal layers 220 and 230 are parallel to a column direction 300 shown in FIG. 2 and perpendicular to the row direction 400. Similarly, the metal layer 230 is aligned with the metal layer 220. As a result, the metal layers 210 and 240 are shown as a layer structure in FIG. 4 but not shown in FIG. 3 due to the different cross-sectional line III—III. In FIGS. 5 and 6, the metal layers 210 and 240 are shown like bars which are not connected to each other, and the metal layer 210 is aligned with the metal layer 240. Similarly, the metal layers 220 and 230 are shown as bars in FIG. 6 and not shown in FIG. 5. In FIGS. 3 and 4, the metal layers 220 and 230 are shown as bars that are not connected to each other, and the metal layer 230 is aligned with the metal layer 220. A layout of the metal layers 210, 220, 230 and 240 resembles a mesh or a net as shown in FIG. 2.

In the invention, each of the metal layers 210, 220, 230, 240 and 250 are connected with the adjacent metal layers by via plugs 214, 224, 234, 244 in the dielectric layers 222, 232, 242, and 252. In order to avoid the peel-off effect, the via plugs are alternately positioned in the adjacent dielectric layers 222, 232, 242, and 252 so as to achieve a uniform distribution of the via plugs 214, 224, 234, 244. For example, the via plug 244 is not aligned with the via plug 234 as shown in FIG. 4. Similarly, the via plug 234 and the via plug 224 are not aligned and the via plug 224 and the via plug 214 are also not aligned as shown in FIG. 2. This structure can effectively avoid the peel-off effect due to a uniform stress. The via plug 224 connecting the metal layers 220 and 230 is only shown in FIGS. 3 and 6. The via plug 214 connecting the metal layers 210 and 220 and the via plug 234 connecting the metal layers 230 and 240 are only shown in FIGS. 4 and 6 due to different cross-sectional views. The via plug 244 connecting the metal layers 240 and 250 is only shown in FIGS. 4 and 5. Furthermore, the via plug 214 is aligned with the via plug 234 and is not aligned with the via plugs 224 and 244, as shown in FIGS. 4 and 6.

A passivation layer 262 is formed on the metal layer 250 with a bonding pad opening 270 used for a subsequent bonding process.

The bonding pad according to the invention includes the stacked metal layer 208 and the metal layer 250. The peel-off effect is effectively avoided by this structure. The area of the p-type substrate 200 overlapped by the metal layers 210, 220, 230 and 240 is decreased by about 50% comparing with the conventional bonding pad. Because of the diffusion region, that is, the p-type doped region 204 in the invention, the junction capacitance $C_P$ between the n-well 202 and the p-type doped region 204, the junction capacitance $C_N$ between the n-well 202 and the p-type substrate 200 and the total equivalent capacitance $C_{Meq}$ between the substrate 200 and the metal layers 210, 220, 230, 240, 250 are series connected. As a result, the parasitic capacitance of the bonding pad is about 50% less than that of the conventional bonding pad.

A layout of the metal layers 210, 220, 230 and 240 mentioned above is not the only way to reduce the area of the p-type substrate 200 overlapped by the metal layers 210, 220, 230 and 240 according to the invention.

Figure 7:
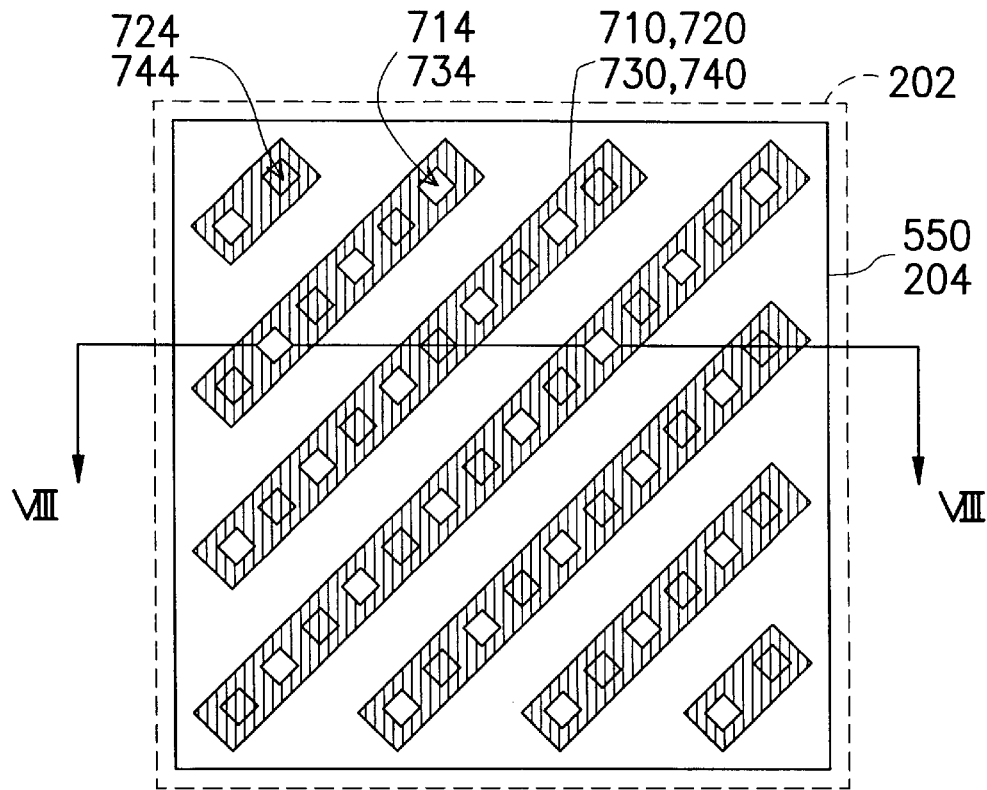
Fig. 7 is a top view of a portion of a substrate, schematically illustrating a bonding pad layout according to the invention.
Figure 8:
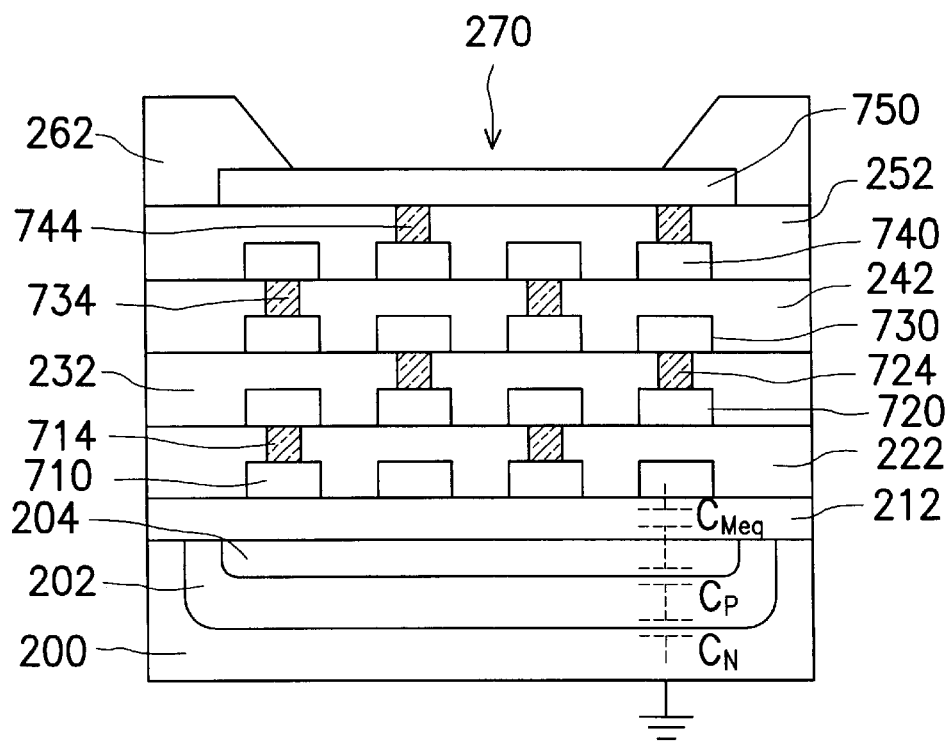
FIG. 8 is a cross-sectional view, schematically illustrating the bonding pad taken along a line VIII—VIII of FIG. 7.

FIG. 7 is a top view of a portion of a substrate, schematically illustrating a bonding pad layout according to the invention, and FIG. 8 is a cross-sectional view, schematically illustrating the bonding pad taken along a line VIII—VIII of FIG. 7. In FIGS. 7 and 8, the metal layers are referred in numerals 710, 720, 730, 740 and 750. Each of the metal layers 710, 720, 730 and 740 are designed as a bar, and the metal layer 750 is a planar layer. The metal layers 710, 720, 730 and 740 are aligned with each other and are isolated by several dielectric layers 212, 222, 232, 242 in between. A top dielectric layer 252 covers the metal layer 740. The metal layer 750 is located on the dielectric layer 252. Additionally, a direction of the metal layers 710, 720, 730 and 740 deviates from the direction 400 (FIG. 2) with an angle, which preferably is 45 degrees in this embodiment.

Referring to FIGS. 7 and 8, each of the metal layers 710, 720, 730, 740 and 750 are coupled with the adjacent metal layers by via plugs 714, 724, 734, 744 in the dielectric layers 212, 222, 232, 242. Positions of the via plugs are not aligned for two adjacent layers. In this manner, the via plug 714 and the via plug 724 are not aligned, the via plug 724 and the via plug 734 are not aligned, and also the via plug 734 and the via plug 744 are not aligned. The via plug 714 and the via plug 734 may be aligned and the via plug 724 and the via plug 744 may be aligned. As a result, the position of the via plug 724 connecting the metal layers 720 and 730 is not superimposed on the position of the via plug 714 used to connect the metal layers 710 and 720 as shown in FIG. 8. The position of the via plug 734 connecting the metal layers 730 and 740 is not superimposed on the position of the via plug 724. However, the via plug 734 is aligned with the via plug 714, and the via plug 744 is aligned with the via plug 724.

Based on a concept of reducing the area of the substrate overlapped by the metal layers, other layouts of the metal layers are also suitable for the invention.

Figure 9:
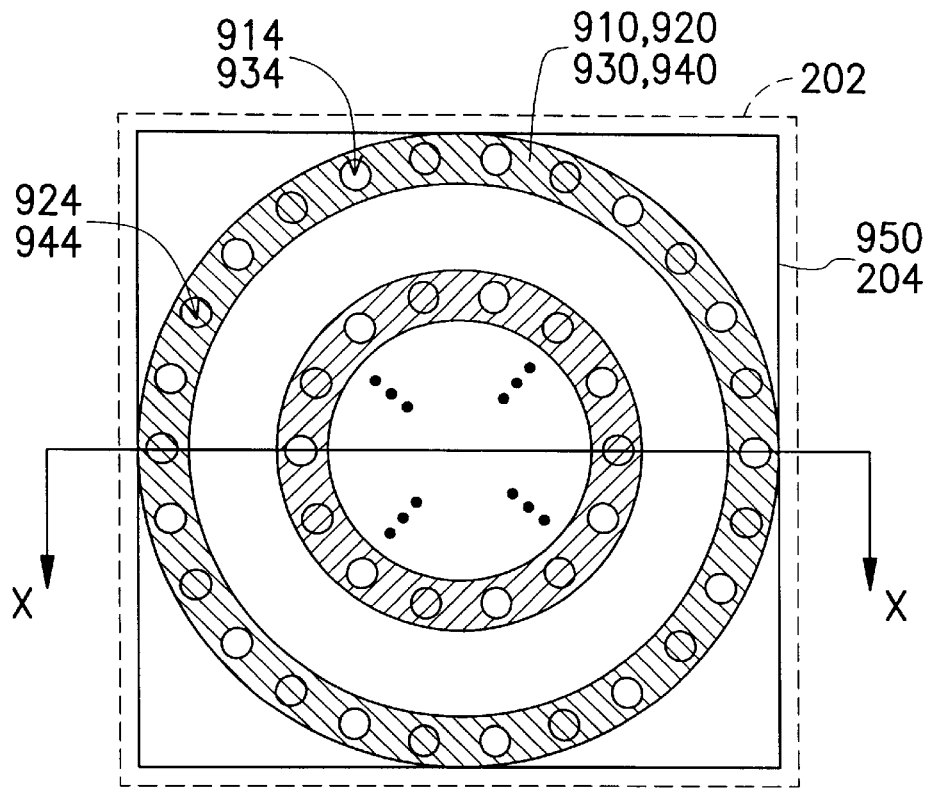
FIG. 9 is another schematic drawing, illustrating a top view of a bonding pad layout according to the invention.
Figure 10:
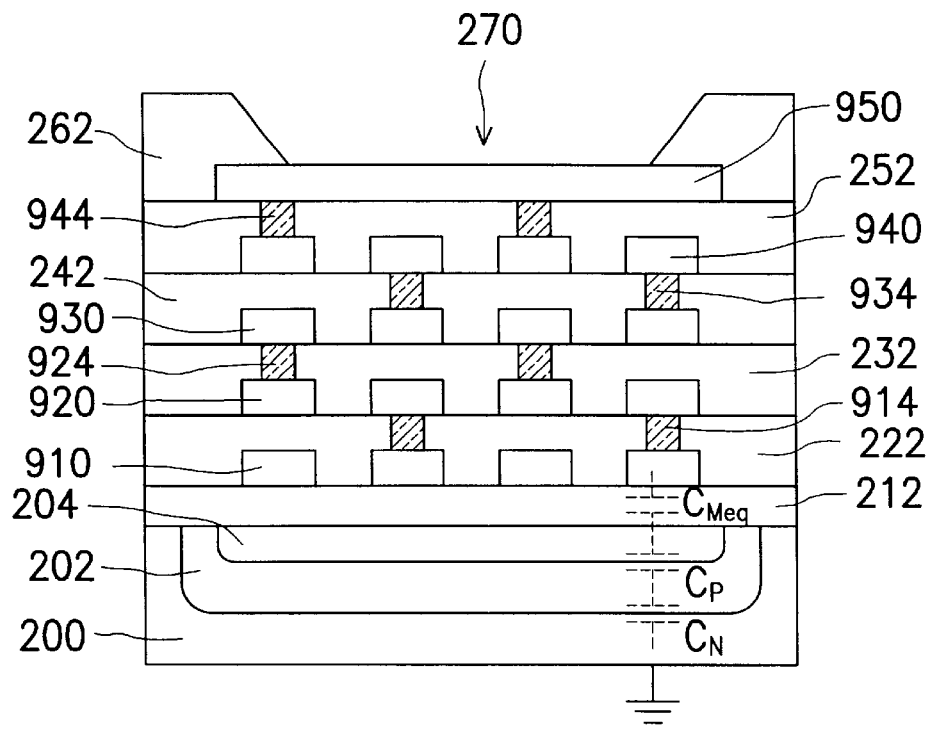
FIG. 10 is a schematic drawing, illustrating a cross-sectional view of FIG. 9 taken along a line X—X.
Figure 11:
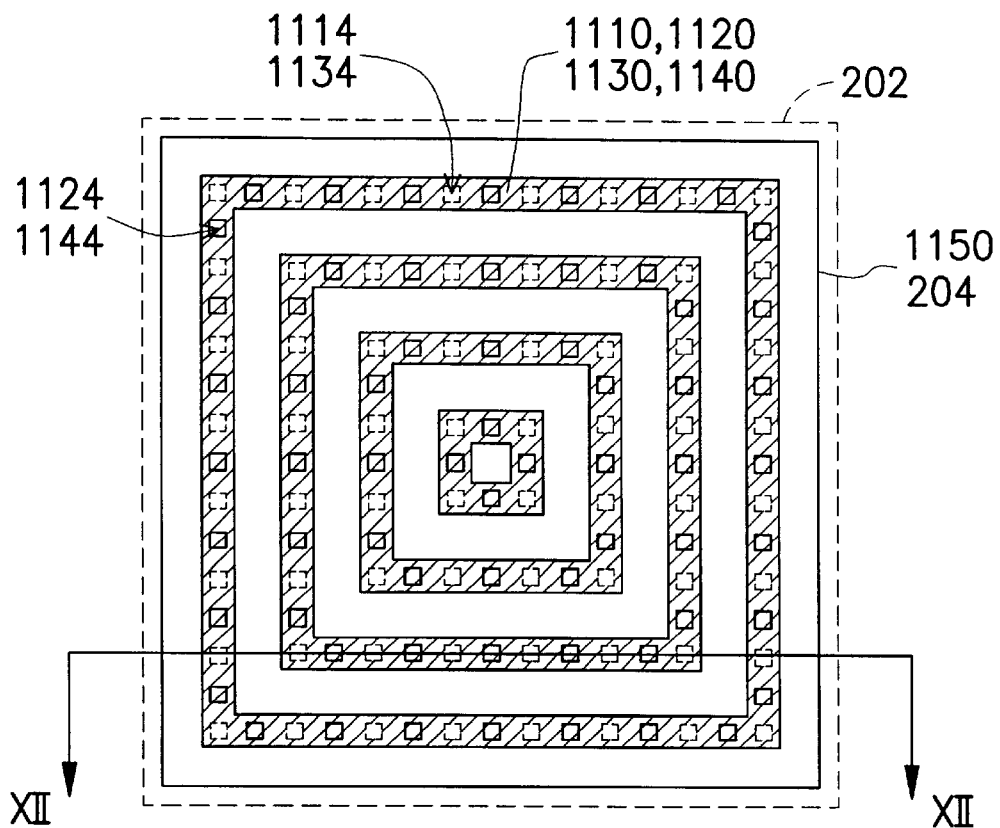
Figure 12:
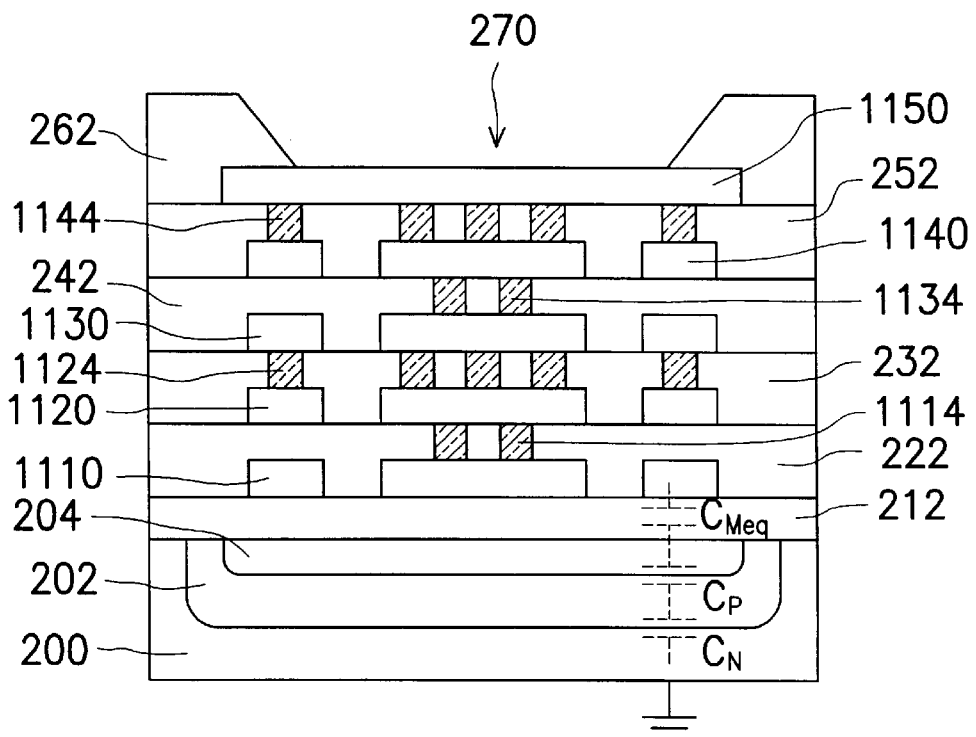
FIG. 12 is a schematic drawing, illustrating a cross-sectional view of FIG. 11 taken along a line XII—XII.
Figure 13:
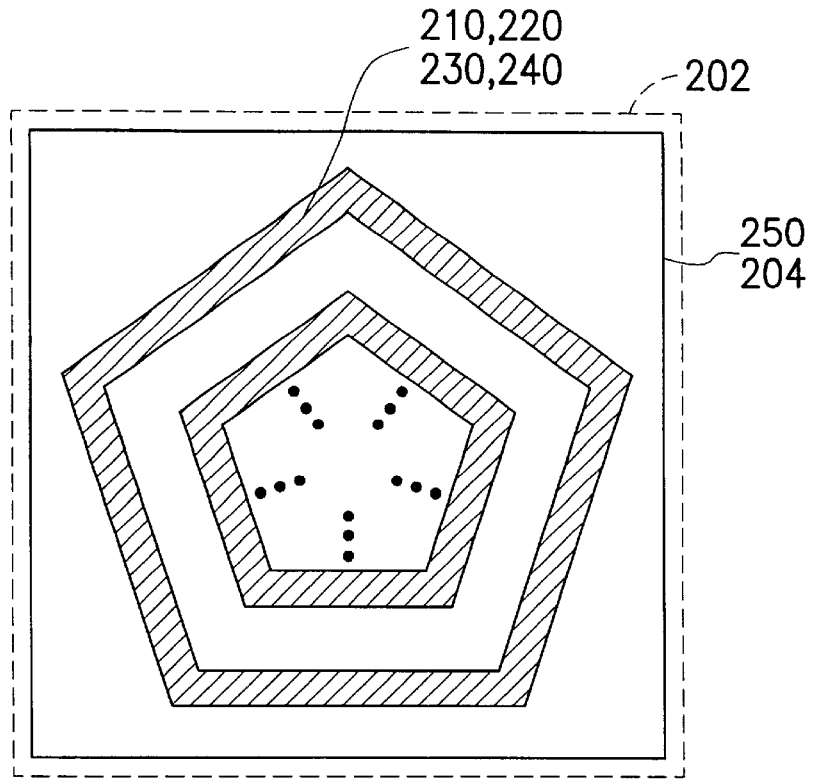
FIGS. 13 through 16 are schematic drawings, illustrating cross-sectional views of bonding pad layouts according to the invention.
Figure 14:
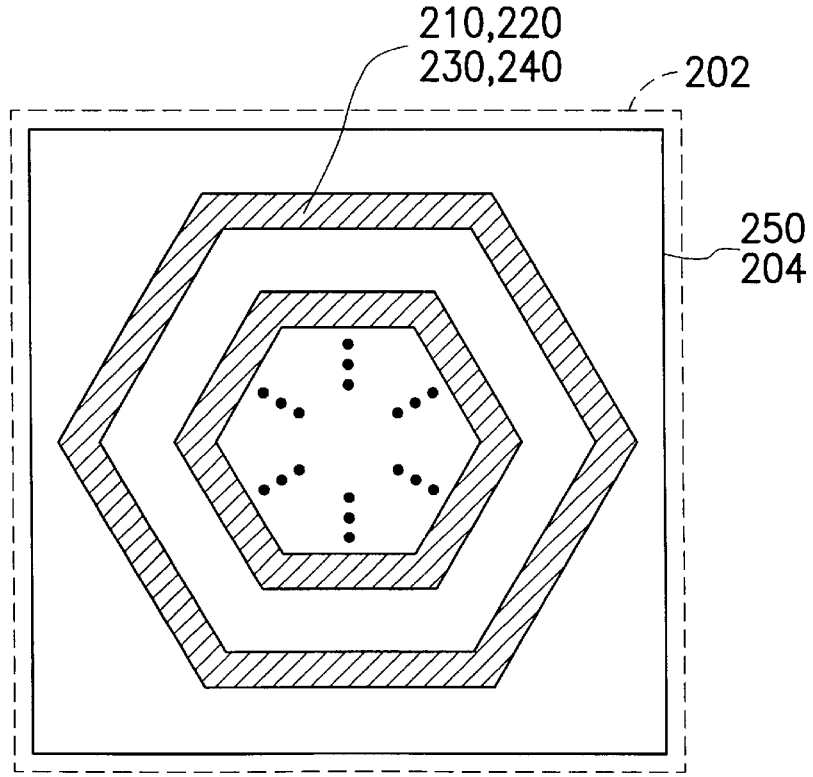
Figure 15:
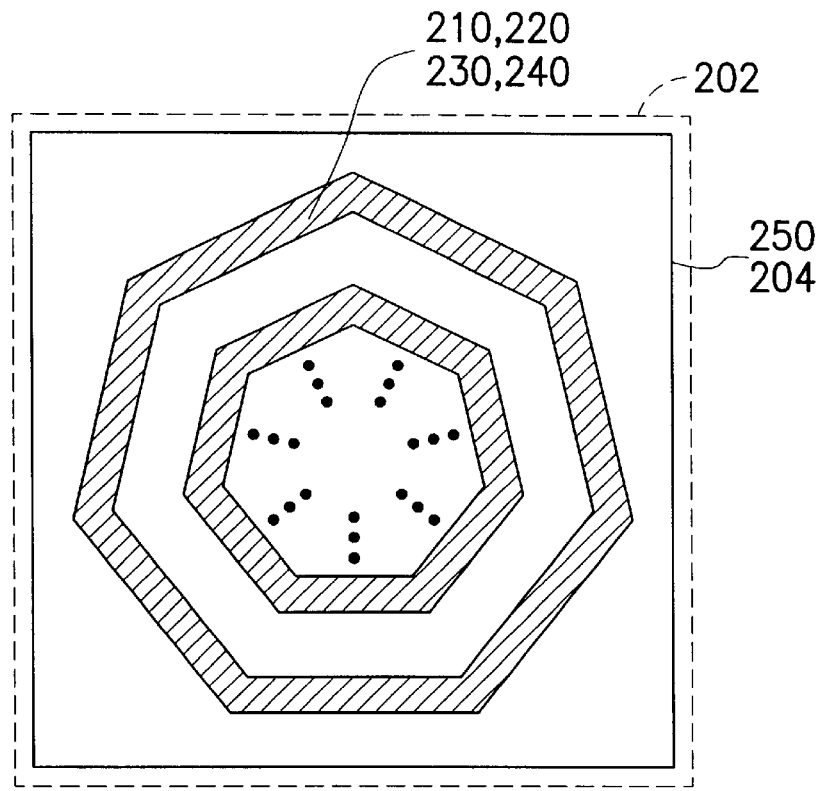
Figure 16:
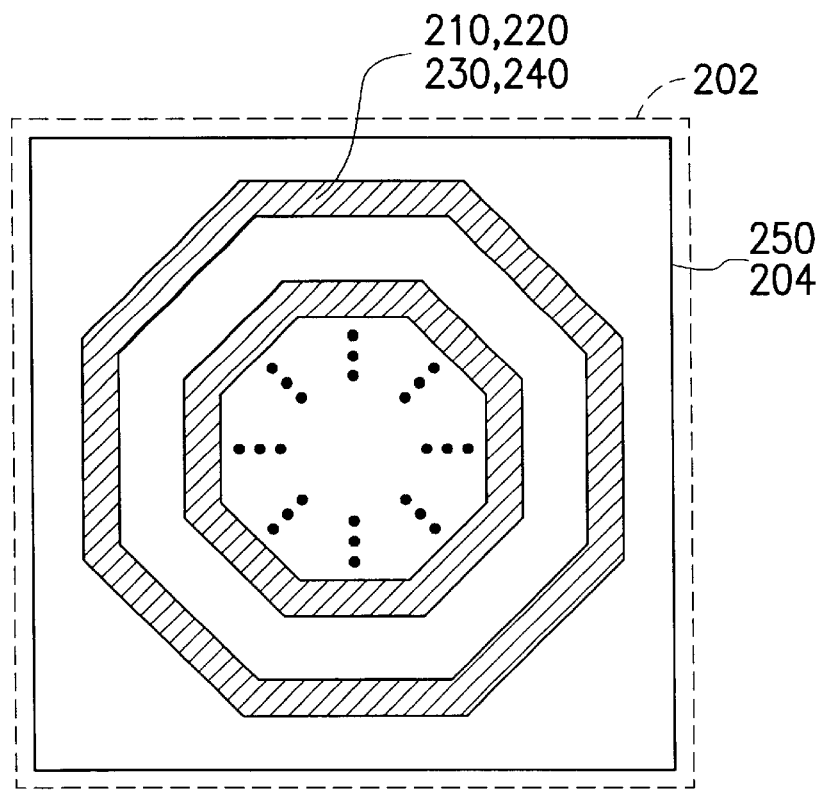

FIGS. 9 and 11 are top views of a portion of a substrate, schematically illustrating another two bonding pad layouts according to the invention, and FIGS. 10 and 12 are cross-sectional views, schematically illustrating the bonding pad layouts respectively taken along lines X—X and XII—XII in FIGS. 9 and FIGS. 10. A layout of the metal layers in FIG. 9 includes, for example, several concentric circles, and a layout of the metal layers in FIG. 11 is concentric polygons, such as squares.

In FIGS. 9 and 10, the metal layers are referred in numerals 910, 920, 930, 940 and 950. Each of the metal layers 910, 920, 930 and 940 are designed as concentric circles, and the metal layer 950 is a planar layer. Referring to FIGS. 9 and 10, the metal layers 910, 920, 930 and 940 are aligned with each other, and each of the metal layers 910, 920, 930, 940, 950 are coupled by via plugs 914, 924, 934, 944, which are formed in several isolation layers, such as the dielectric layers 212, 222, 232, 242, 252 as shown in the previous examples. Again, the via plugs 914, 924, 934, 944 are alternately distributed for the two adjacent layers. The design concept of this layout is the same as the previous designs.

In FIGS. 11 and 12, the metal layers are referred to by numerals 1110, 1120, 1130, 1140 and 1150. The metal layers 1110, 1120, 1130 and 1140 are designed as concentric squares, and the metal layer 1150 is a plane. Referring to FIGS. 11 and 12, the metal layers 1110, 1120, 1130 and 1140 are aligned with each other, and each of the metal layers 1110, 1120, 1130, 1140 and 1150 are coupled with the adjacent metal layers by via plugs 1114, 1124, 1134 and 1144. The design concept of this layout is the same as the previous designs.

FIGS. 13, 14, 15 and 16 are top views of a portion of a substrate, schematically illustrating other bonding pad layouts for the metal layers 210, 220, 230 and 240 according to the invention. Layouts of the metal layers in FIGS. 13, 14, 15 and 16 respectively are concentric pentagons, concentric hexagons, concentric heptagons and concentric octagons. The design concept of these layouts is the same as the previous examples. According to the concept, other kinds of polygons are also acceptable in the invention.

Figure 17:
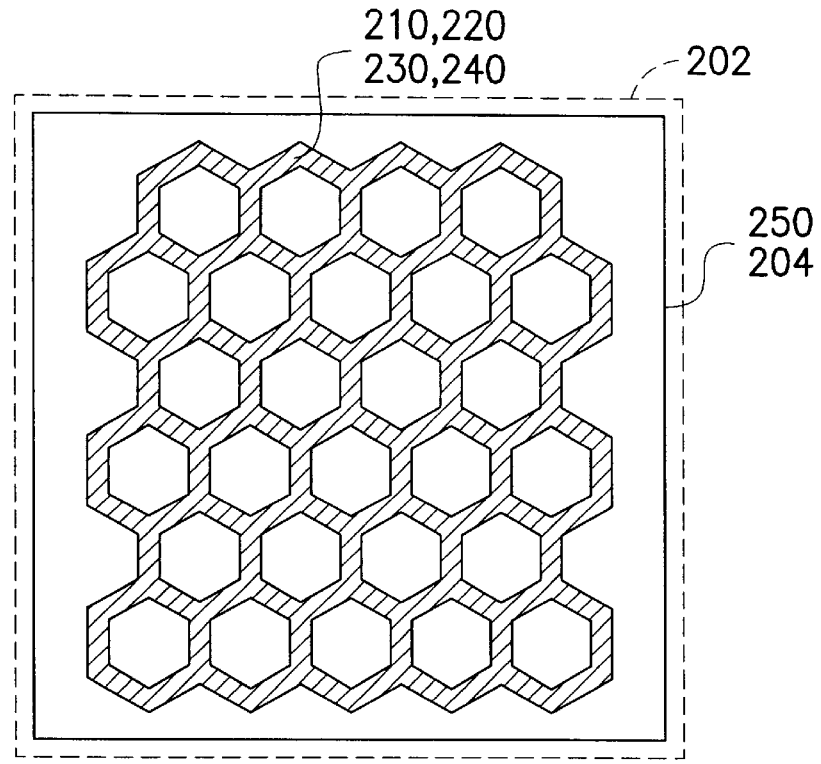
FIGS. 17 through 22 are schematic drawings, illustrating cross-sectional views of bonding pad layouts according to the invention.
Figure 18:
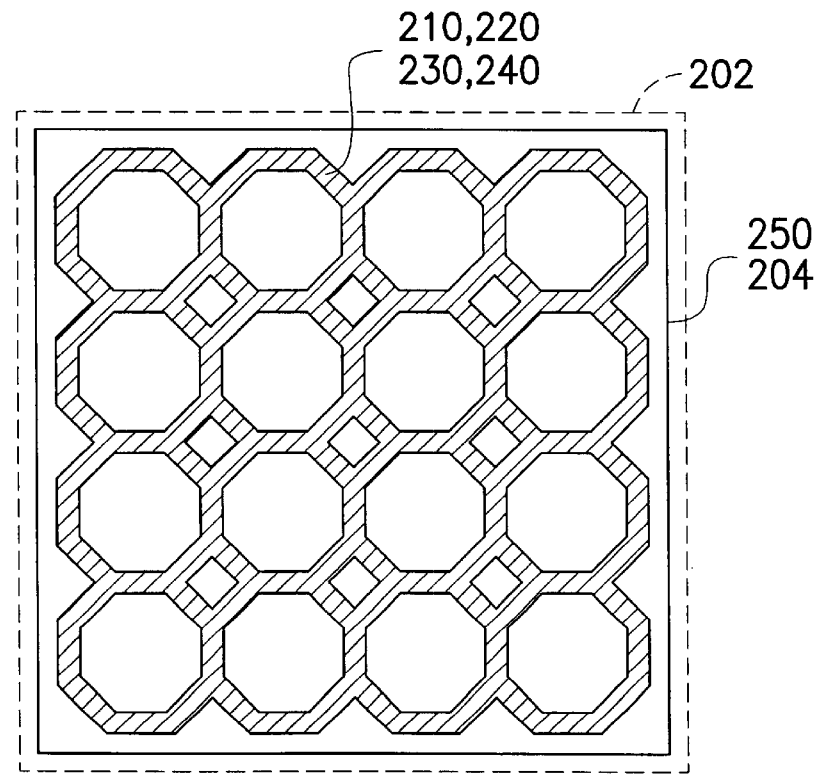
Figure 19:
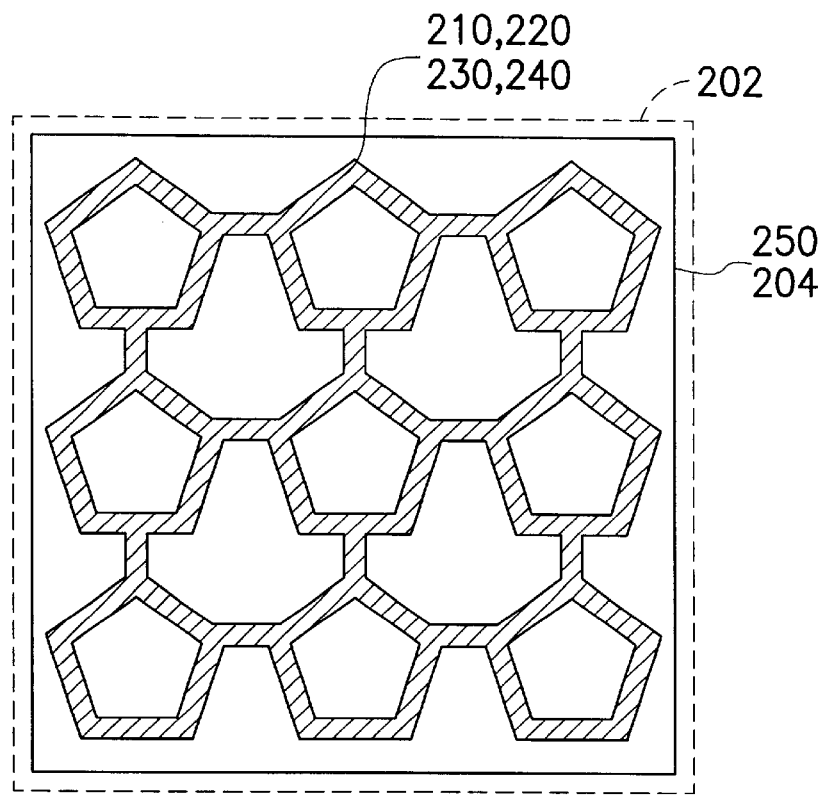
Figure 20:
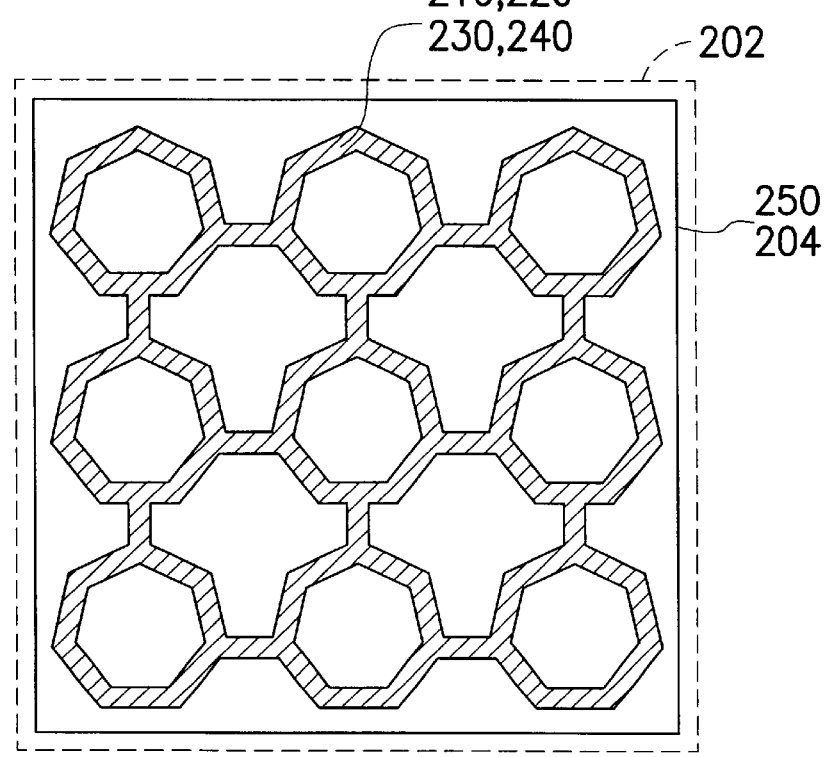
Figure 21:
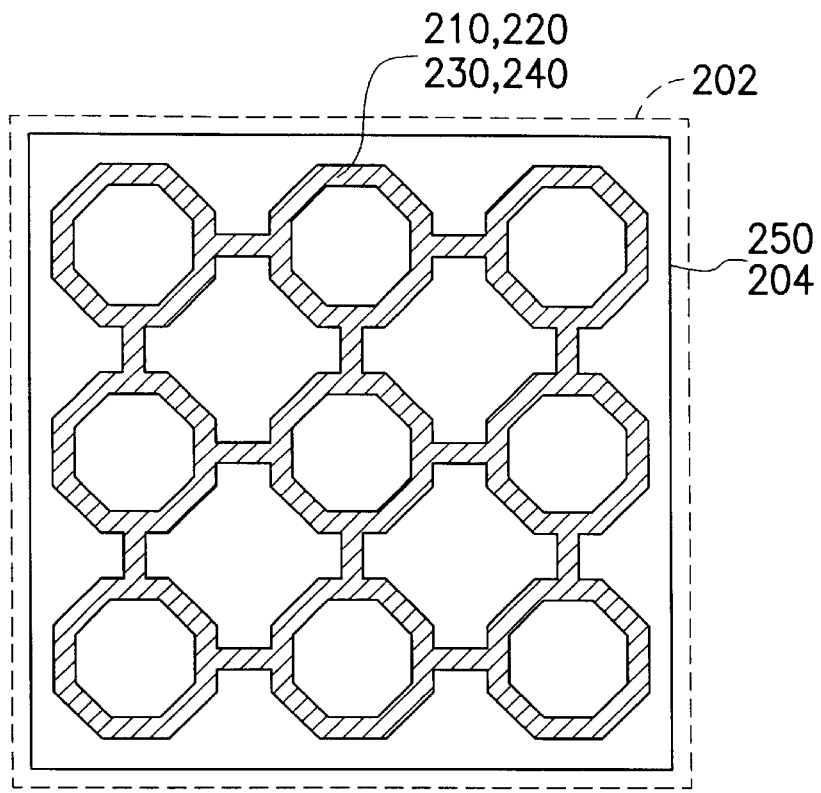
Figure 22:
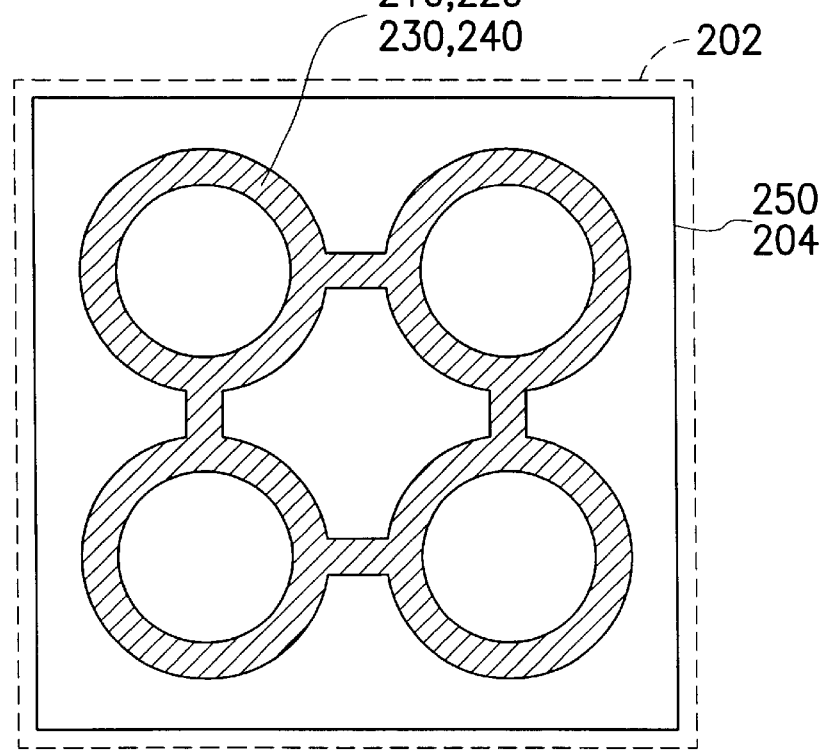

In FIGS. 17 and 18, the layouts of the metal layers 210, 220, 230 and 240 resemble meshes. The layout shown in FIG. 17 is a honeycombed type mesh, and the layout shown in FIG. 18 is a mesh composed of adjacent octagonal units arranged in rows. The mesh in the invention comprises a mesh composed of a unit shape as seen in FIGS. 17 and 18. However, a mesh composed of various unit shapes is suitable for the invention. In FIG. 19, the layout of the metal layers 210, 220, 230 and 240 is a mesh composed of rows of pentagonal structures connected by a line, with each pentagonal unit connected to the pentagon in the row above or below by a line. Each unit shape of the mesh is changed to a heptagon, an octagon and a circle in FIGS. 20, 21 and 22, respectively. Also, other kinds of polygons are acceptable.

Although only a few layouts for the metal layers are disclosed in the embodiment. An implementation of the layout is not limited by the disclosed examples because the concept disclosed in the invention is to reduce the area of the substrate overlapped by the metal layers. By this concept, the parasitic capacitance of the bonding pad is reduced and the peel-off effect is avoided. As a result, any kind of layout that meets the concept is suitable for the invention. The bonding pad layout can be designed with many types of unit shape that meet the concept, so that any kind of geometry is suitable for use in the invention.

EXAMPLE 2

In a conventional semiconductor device, the bonding pad is not formed above an active device region or circuit region because a subsequent bonding wire process could damage the formed device.

This issue can also be solved by the invention. Since the bonding pad of the invention include a top metal layer 250 of FIG. 4 and the stacked metal layer 208. The bonding pad opening 270 can be adjusted at the location above the device region. As a result, the available substrate surface can be more efficiently used.

Figure 23:
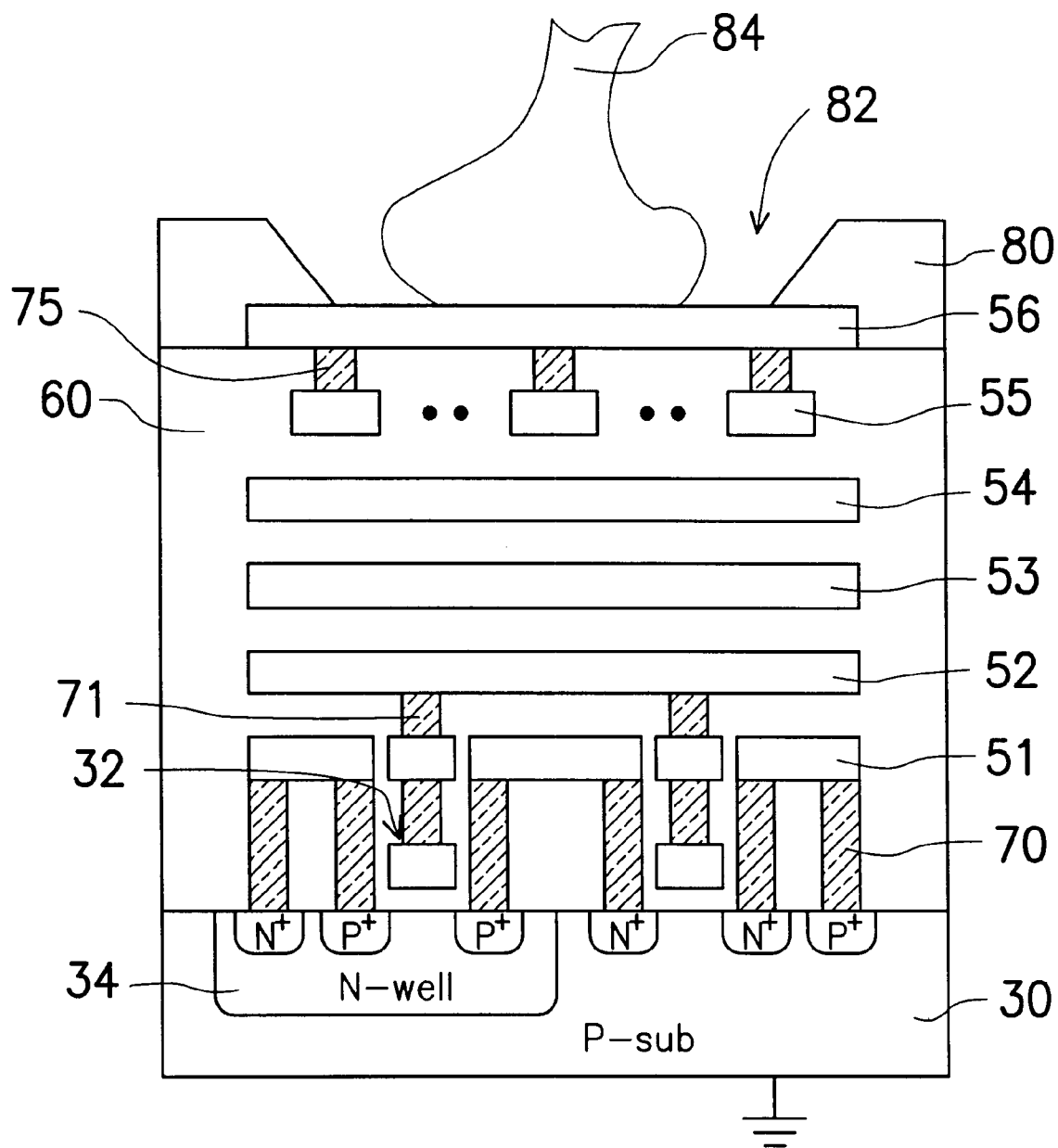
FIG. 23 is a schematic drawing, illustrating a cross-sectional view of another bonding pad layout according to the invention.

FIG. 23 is a cross-sectional view, schematically illustrating a bonding pad layout with a device, according to the invention. In this example 2, devices are formed on the substrate just under the bonding pad.

Referring to FIG. 23, a device 32, such as a field effect transistor, is formed on a substrate 30. Metal layers 51, 52, 53, 54, 55 and 56 are formed in a dielectric layer 60 over the device 32, in which the dielectric layer 60 serves as an isolation and a frame to stack the metal layers 51, 52, 53, 54, 55, 56. The dielectric layer 60 can also further include several sub-layers to hold and isolate the metal layers. A bonding pad includes the metal layers 55 and 56 and is covered by a passivation layer 80. The passivation layer 80 includes a bonding pad opening 82, which exposes a portion of the metal layer 56. The metal layers 51 and 52 near the substrate 30 are used to serve as, for example, signal lines, and the metal layers 53 and 54 are designed to be planar layers and used to serve as, for example, power lines. The passivation layer 80 is formed on the dielectric layer 60, and the bonding pad opening 82 is formed in the passivation layer 80 to expose the metal layer 56. A bonding wire 84 is attached to the metal layer 56 within the bonding pad opening 82. Each pair of the metal layers 51, 52, 53, 54, 55 and 56 is isolated by the dielectric layer 60. The metal layer 51 is connected to the doped regions in the substrate 30 by a via plug 70. The metal layers 55, 56 are coupled by a via plug 75 and the metal layers 51, 52 are coupled by a via plug 71. The metal layers 52, 53 and 54 serving as signal lines and power lines are also coupled by via plugs (not shown), and the metal layers 54 and 55 are similar. However, these via plugs should not be formed under the bonding pad opening 82. Thus, the metal layers 53, 54 can be used to be the buffer layers, and the bonding stress borne on the active devices can be reduced through these buffer layers.

In the invention, the device 32, such as a CMOS device, is formed on the substrate 30 or an n-well 34 in the substrate 30. The metal layer 56 is a plane, and the metal layer 55 is designed as applying one of the layouts shown in example 1 for the metal layer 55 so that the parasitic capacitance and the bonding reliability of the bonding pad are effectively reduced and increased, respectively.

According to the foregoing, the advantages of the invention include the following:

1. The bonding pad in the invention is formed by multiple metal layers and buried deeply in the dielectric layer, so that the peel-off effect is avoided and the bonding reliability effectively increases.
2. In the invention, the overlapping area of between the substrate and the metal layers is greatly reduced. The parasitic capacitance of the bonding pad is reduced.
3. A diffusion region is formed in the substrate so that the contact capacitance of the diffusion region and the capacitance of the bonding pad are connected in series. The parasitic capacitance of the bonding pad is reduced.
4. The invention is compatible with the current conventional processes. Only the layout design of the bonding pad is changed to meet the requirement of a semiconductor device. Manufactures can achieve the bonding pad structure of the invention without modifying their fabrication processes.
5. The device can be formed under the bonding pad so that the substrate surface is more efficiently used for compact circuit layout.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A low-capacitance bonding pad structure for a semiconductor device, the structure comprising:
    a substrate;
    a plurality of metal layers stacked on the substrate, wherein each of the metal layers has a plurality of slant metal bars at an angle less than 90 degrees and parallel to one another, and a dielectric layer spaces apart the adjacent metal layers from each other, with the metal layers being coupled by a plurality of via plugs in the dielectric layer to reduce the area of the substrate overlapped by the metal layers;
    an uppermost metal layer positioned on the stack, wherein an area of each metal layer in the stack is smaller than that of the uppermost metal layer; and
    a passivation layer having a bonding pad opening positioned on the uppermost metal layer, wherein the bonding pad opening exposes a portion of the uppermost metal layer.

2. The structure of claim 1, wherein the metal layer is not aligned with the adjacent metal layer in the stack.

3. The structure of claim 1, wherein locations of the via plugs in two adjacent layers of the dielectric layers are shifted with a proper distance.

4. The structure of claim 1, wherein an upper surface of the passivation layer is higher than an upper surface of the uppermost metal layer.

5. A semiconductor structure, the structure comprising:
    a substrate;
    a bonding pad comprising a metal-layer stack and an uppermost metal layer on the substrate, wherein the stack comprises a plurality of metal layers and a plurality of dielectric layers alternatingly stacked up, and each of the metal layers has a plurality of slant metal bars at an angle less than 90 degrees and arranged parallel to one another and is coupled to other metal layers in the stack by a plurality of via plugs formed in the dielectric layers, wherein the via plugs in adjacent dielectric layers are arranged in an alternating manner to reduce the area of the substrate overlapped by the metal layers; and
    a semiconductor device located on the substrate just under the bonding pad.

6. The structure of claim 5, wherein an area of each metal layer in the stack is smaller than that of the uppermost metal layer.

7. The structure of claim 5, wherein the structure further comprises a signal line and a power line between the device and the bonding pad.

8. The structure of claim 5, wherein the device on the substrate just under the bonding pad is an active device.

9. The structure of claim 5, wherein the device on the substrate just under the bonding pad is a passive device.

10. The structure of claim 5, wherein the metal layer is aligned with the adjacent metal layer in the stack.

11. The structure of claim 5, wherein the metal layer is not aligned with the adjacent metal layer in the stack.

12. A low-capacitance bonding pad structure for a semiconductor device, the structure comprising:
    a substrate having a well;
    a doped region as a diffusion region formed in the well; and
    a bonding pad comprising a metal-layer stack and an uppermost metal layer on the substrate and aligned with the doped region, wherein the stack comprises a plurality of metal layers and a plurality of dielectric layers alternating stacked up, with an area of each metal layer of the stack being smaller than that of the uppermost metal layer, and each of the metal layers has a plurality of slant metal bars at an angle less than 90 degrees and arranged parallel to one another to reduce the area of the substrate overlapped by the metal layers.

13. The structure of claim 12, wherein the type of the ions doped in the doped region is opposite to those in the well.

* * * * *